(12) United States Patent
Kao et al.

(10) Patent No.: US 7,301,847 B2
(45) Date of Patent: Nov. 27, 2007

(54) METHOD AND DEVICE FOR A MAIN BOARD COMMONLY ASSOCIATED WITH DDR2 OR DDR1

(75) Inventors: Yi-Sheng Kao, Taipei Hsien (TW); Shao-Ping Lo, Taipei Hsien (TW)

(73) Assignee: Wistron Corp., Taipei Hsien 221 (TW)

( * ) Notice: Subject to any disclaimer, the term of this patent is extended or adjusted under 35 U.S.C. 154(b) by 566 days.

(21) Appl. No.: 10/867,694

(22) Filed: Jun. 16, 2004

(65) Prior Publication Data
US 2005/0199916 A1 Sep. 15, 2005

(30) Foreign Application Priority Data
Mar. 12, 2004 (TW) .............................. 93106781 A

(51) Int. Cl.
*G11C 5/14* (2006.01)
(52) U.S. Cl. ..................... 365/226; 365/230.03; 365/63
(58) Field of Classification Search ................ 365/226, 365/230.03, 63
See application file for complete search history.

(56) References Cited

U.S. PATENT DOCUMENTS 6,621,754 B1   9/2003 Chang ........................ 365/226
6,674,684 B1 *  1/2004 Shen ...................... 365/230.03
7,007,178 B2   2/2006 Tseng et al. ................ 713/300

* cited by examiner

*Primary Examiner*—Huan Hoang
(74) *Attorney, Agent, or Firm*—Troxell Law Office, PLLC

(57) ABSTRACT

A method and device for a main board commonly shared with DDR2 or DDR1 includes allowing the main board being associated with a voltage transducer and a DDR2 connector, the voltage transducer outputting a voltage suitable for DDR2 to the DDR2 connector via the output end thereof in case of the main board being joined to DDR2, and the DDR2 connector being connected to an adapter and the adapter having another end thereof connecting a DDR1 connector with the voltage transducer having the input end thereof connecting the ground end of the adapter in case of the main board being joined to DDR1 such that the voltage transducer can output a voltage suitable for DDR1 to the DDR1 connector via the output end thereof. Hence, the main board is capable of being associated with DDR2 or DDR1 to overcome the problem created during fabricating the main board individually.

10 Claims, 3 Drawing Sheets

METHOD AND DEVICE FOR A MAIN BOARD COMMONLY ASSOCIATED WITH DDR2 OR DDR1

BACKGROUND OF THE INVENTION

1. Field of the Invention

The present invention is related to a method and device for the main board of a computer associated with different memories and particularly to a method and device for the main board commonly associated with either DDR2 or DDR1.

2. Brief Description of Related Art

Due to the computer keeping incessantly change, the memories used in the computer also have been changed to higher speed memories such as Rambus, DDR1 (Double Data Ram I) and DDR2 (Double Data Ram II), which will be available in the market soon, from EDO memory and SIMM used in the past. Under the environment of fast development for memory fabrication technique, the winner in the sharply changeable market is the one who can hold the change timely.

DDR2 is coming soon and it is foreseen that a main board with DDR2 will become the mainstream of the market gradually. Because DDR1 must be cheaper than DDR2, the main board with DDR1 still has its necessity in the market. Currently, no main board has been arranged to be capable of being associated with either DDR2 or DDR1 in the field of main board design. It means that it is not possible for a connector being commonly used with DDR2 and DDR1. Owing to design of the main board being unable to offer multiple functions, it is required to make the main board with DDR2 and the main board with DDR1 individually. As a result, more main boards have to be fabricated with more production cost and the gross inventory of the main board with DDR2 and the main board with DDR1 will increase significantly. In addition, the customer end will decrease inventory due to cost increase. If an adapting device can be designed to allow the same main board being possible to join with DDR2 or DDR1, the preceding problem regarding the main board being made differently can be solved effectively.

Taiwanese Patent Publication No. 566617 discloses a data accessing flash memory adapter, which provides a convert cartridge with periphery thereof having a compact flash (CF) slot, a Universal Serial Bus (UBS) socket and a PCMCTA interface (international standard interface) plug for being connected to a CF flash memory, a USB interface and a PCMCIA interface, such that the CF flash memory can be connected to data accessing device of the USB interface or the PCMCIA interface or to the main unit of a computer. However, the preceding adapter is incapable of being joined to DDR2 or DDR1 so that the adapter cannot be utilized for a main board commonly suitable for DDR2 and DDR1.

SUMMARY OF THE INVENTION

An object of the present invention is to provide an adapting device for allowing a main board being commonly used by DDR2 or DDR1.

Another object of the present invention is to provide an adapting device, which makes a main board possible to join with either DDR2 or DDR1, so as to enhance fabrication capability for the main board and lower production cost and inventory thereof with promoting sales competition of main board.

A further object of the present invention is to provide a method for a main board being able to be associated with DDR2 or DDR1 so as to perform one main board with multiple functions.

Basically, the present invention allows the main board joining with a DDR2 connector or an adapter with which a DDR1 connector can be joined for being associated with DDR1. A voltage transducer is utilized to offer power needed by DDR2 or DDR1 via the output end thereof. The voltage transducer outputs a voltage suitable for DDR2 to the DDR2 connector via the output end thereof in case of the main board being joined to DDR2 and outputs a voltage suitable for DDR1 by way of the input end of the voltage transducer being grounded in case of the main board being joined to DDR1. In this way, the function of either DDR2 or DDR1 being joined to the same main board can be performed effectively.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Usually, DDR2 has 240 pins with a power source of about 1.8V and DDR1 has 184 pins with a power source of about 2.5V. Due to DDR2 providing different number of pins and voltage from DDR1, it is not possible for DDR2 using a common connector with DDR1. Thus, it is necessary to have an adapter for connecting with DDR2. The adapter has a grounding end and is capable of connecting with the connector of DDR1. Further, a voltage transducer is required to supply voltage needed by DDR1 or DDR2 while the input end thereof connects with the ground end of the adapter.

A method for either DDR2 or DDR1 commonly using a main board according to the present invention is to allow the main board attached with the voltage transducer and a DDR2 connector. The voltage transducer outputs a voltage suitable for DDR2 to the DDR2 connector via the output end thereof during the main board being joined to DDR2. The DDR2 connector is connected to an end of an adapter and another end of the adapter is connected to the DDR1 connector in addition to the input end of the voltage transducer connecting with the ground end of the adapter during the main board being joined to DDR1 such that the output end of the voltage transducer can output a voltage suitable for DDR1 to the DDR1 connector. In this way, the main board is capable of being associated with DDR2 and DDR1.

Figure 1:
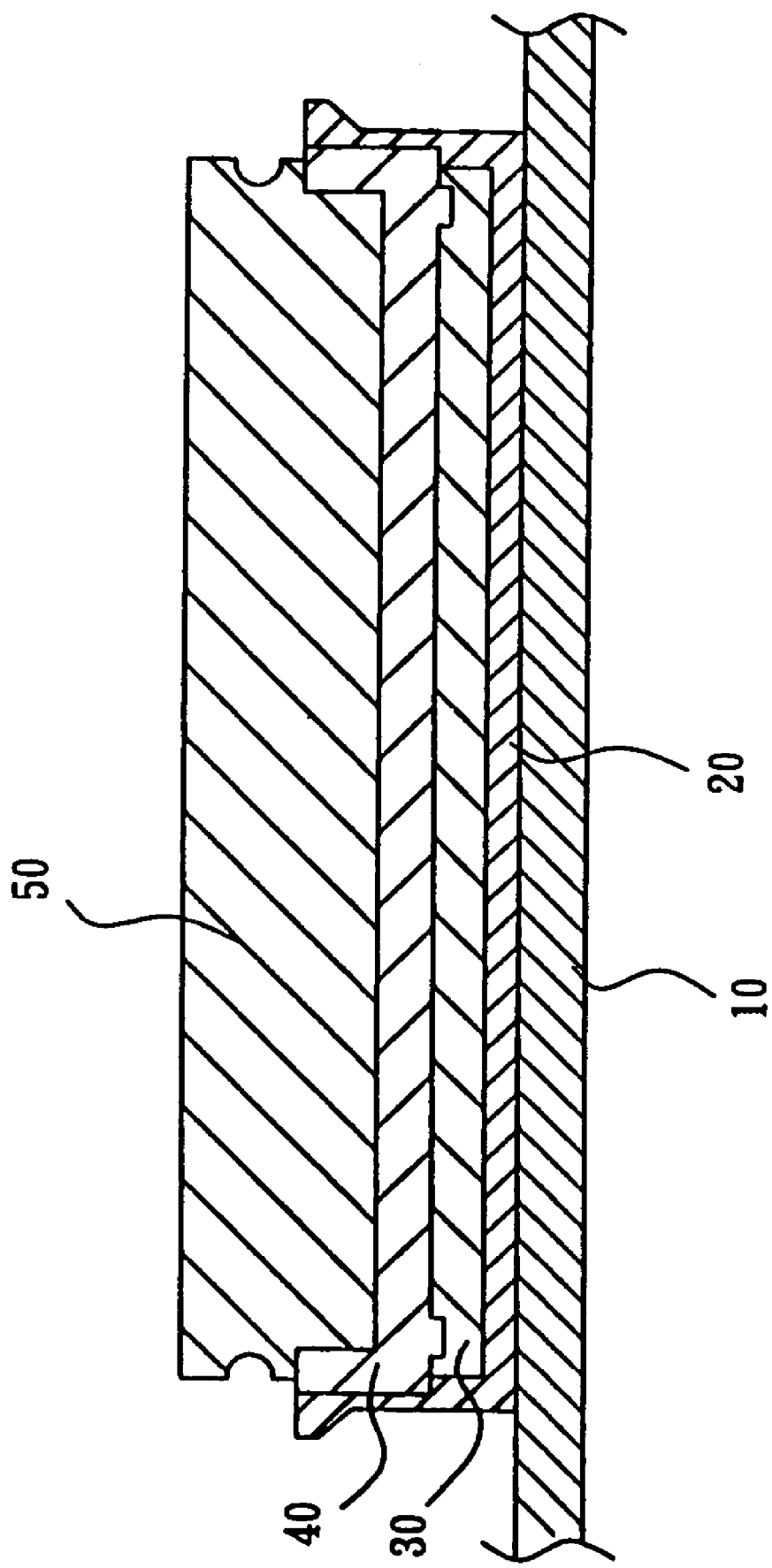
FIG. 1 is a sectional view illustrating an adapter associated with the DDR2 and the DDR1 in a preferred embodiment of the present invention.
Figure 2:
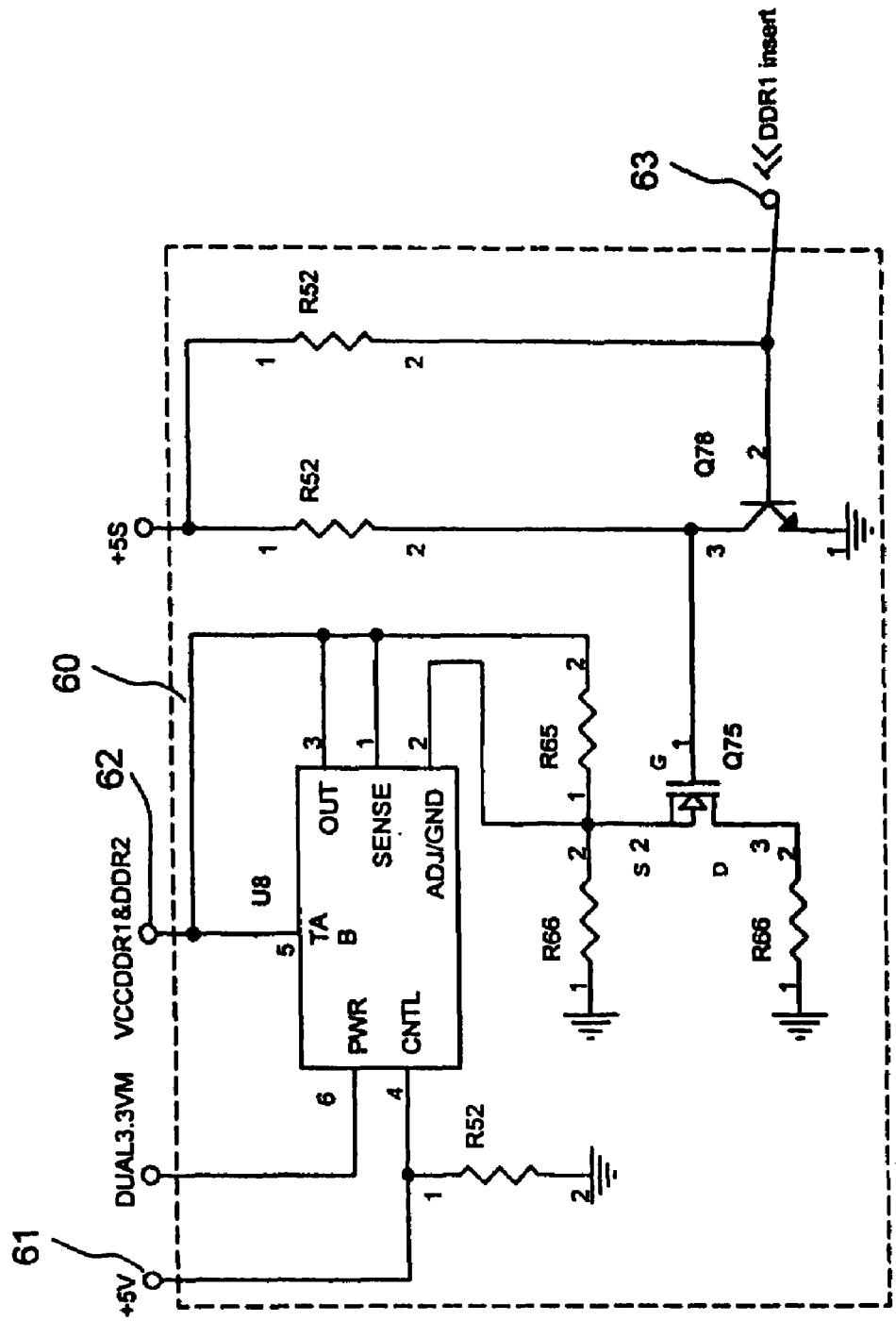
FIG. 2 is a circuit diagram of the voltage transducer in the preferred embodiment.

Referring to FIGS. 1 and 2, an adapting device for the main board 10 being capable of being associated with DDR2 and DR1 basically includes an adapter 30 and a voltage transducer 60. The main board 10 is connected to a DDR2 connector 20 for being joined to DDR2. The adapter 30 is connected to the DDR2 connector 20 at one side thereof and connected to a DDR1 connector 40 at another side thereof such that the main board 10 can be joined to DDR1 50 in case of the main board 10 being detached from DDR2.

Referring to FIG. 2, the voltage transducer 60 is used for supplying voltages needed by DDR2 and DDR1. The voltage transducer 60 basically includes a chip U8, a CMOS (Metal-Oxide-Semiconductor) Q75, a transistor Q78 and multiple related resistors. The chip U8 has a fourth connecting end, which is the input end 61, to connect with 5V power source and a grounding resistance R52 respectively. A resistance R65 is disposed between a first connecting end and a second connecting end of the chip U8 to connect the first and the second ends. The joint of the resistance R65 and the second connecting end further connects with a grounding resistance R66 and the source electrode of the CMOS Q75. The leak electrode of the CMOS Q75 connects with another grounding resistance R66. The grid of the CMOS Q75 connects with the collector of the transistor Q78 and a resistance R52 and 5V power source connects with another end of the resistance R52. The transistor has the emitter thereof being grounded and the base electrode thereof connects another resistance R52. The 5V power source connects with the other end of the second resistance R52. The chip U8 has a fifth connecting end which connects with the second and the third connecting ends thereof as an output end 62 of the power source for DDR2 and DDR1. The output end 62 connects the DDR2 connector and also can be connected to the adapter. The joint of the base electrode of the transistor Q78 and the second resistance R52 is acted as an input end 63 for grounding the voltage transducer 60.

The input end 63 of the voltage transducer being grounded or not depends on the output end 62 outputting operation voltage for DDR1 or DDR2.

In case of the input end 63 of the voltage transducer being grounded, the base electrode of the transistor Q78 is grounded with the potential thereof is 0 and the potential of the collector being 5V so that the grid of the CMOS Q75 has the potential thereof is 5V too. When the CMOS Q75, which has been properly chosen, is provided with the grid thereof having potential greater than 5V, the source electrode and the leak electrode are in a state of short circuit and the output voltage via the output end 62 for DDR1 can a higher voltage of around 2.5V due to the current passing through the resistance R65 and being divided to pass through two resistances R66 to occur voltage drop.

In case of the input end 63 of the voltage transducer being not grounded, the base electrode of the transistor Q78 is not grounded with the potential thereof is greater than 0 and the potential of the collector being less than 5V so that the grid of the CMOS Q75 has the potential thereof is less than 5V too. The CMOS Q75 has the grid thereof having potential less than 5V so that the source electrode and the leak electrode are not in a state of short circuit and the output voltage via the output end 62 for DDR2 can be a lower voltage of around 1.8V due to the current passing through the resistances R65 and R66 to occur voltage drop.

Figure 3:
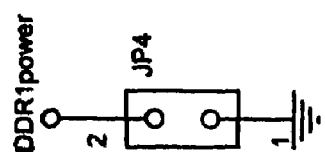
FIG. 3 is plan view illustrating the adapter being grounded.

Referring to FIG. 3, the adapter of the preferred embodiment is provided with two additional pins in addition to the connecting pins for being joined to the DDR2 connector and one of the two additional pins is grounded and the other one of the two additional pins is connected to a connecting end on the adapter for connecting with the DDR1 connector for supplying DDR1 power. The two additional pins can be joined to form a connector JP4 with two ends, which connect with the two additional pins, being connected to the input end 63 and the output end 62 of the voltage transducer 60 shown in FIG. 2. When the adapter connects with the DDR2 connector and the connector JP4 connects with the two additional joints, the voltage transducer 60 has the input end 63 thereof is grounded so as to output higher voltage via the output end 62 thereof for DDR1. Otherwise, the voltage transducer 60 outputs lower voltage via the output end thereof for DDR2.

Figure 4:
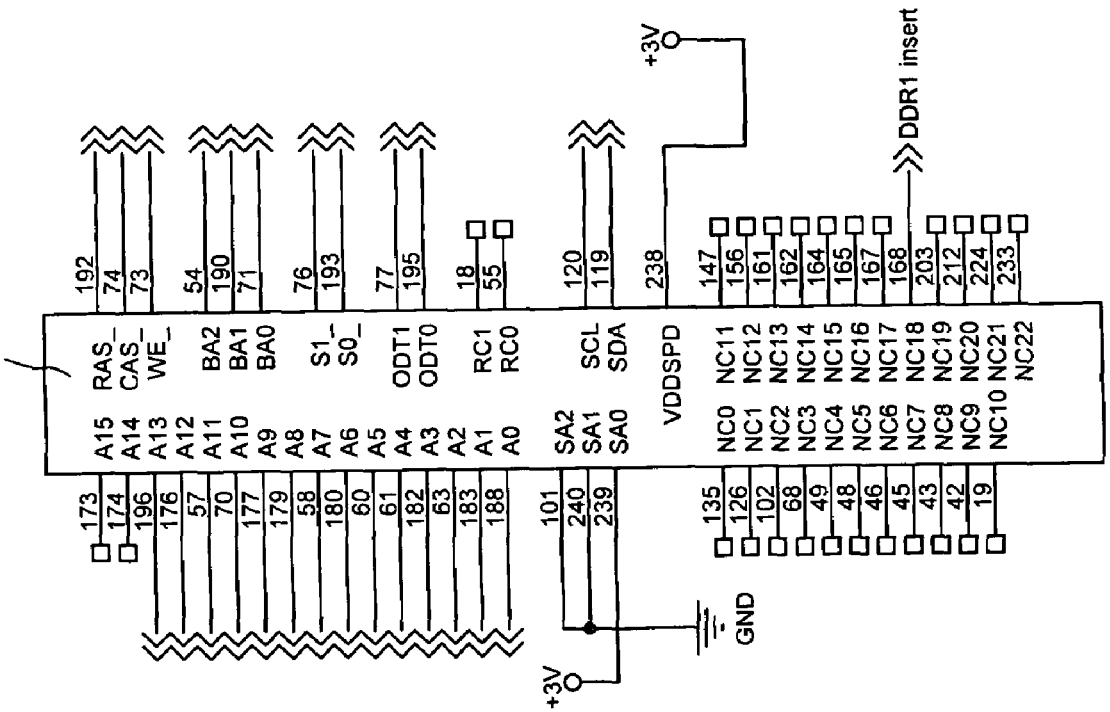
FIG. 4 is a block diagram of the DDR2.

Referring to FIG. 4, another embodiment of the present invention provides one of the pins in the adapter for connecting with the DDR2 connector is grounded and the pin is disposed corresponding to one of NC0-NC22, which are in the DDR2 51 and unused generally, for instance, pin NC18. Therefore, the connecting end of DDR2 connector corresponding to pin NC18 is connected to the input end 63 of the voltage transducer 60 shown in FIG. 2 by way of lead wires. When the adapter is connected to the DDR2 connector, the input end 63 of the voltage transducer 60 is grounded and the output end 62 thereof outputs higher voltage for DDR1. Otherwise, The voltage transducer 60 outputs lower voltage for DDR2 via the output end 62.

It is appreciated that the method of the present invention allows a main board being capable of joining with either DDR2 or DDR1 to enhance production capability for a main board to reduce production cost and inventory and promote sale competition of the main board.

While the invention has been described with referencing to a preferred embodiment thereof, it is to be understood that modifications or variations may be easily made without departing from the spirit of this invention, which is defined by the appended claims.

What is claimed is:

1. A method for adapting a main board having a DDR2 connector and lacking an onboard DDR1 connector for use with DDR1 comprising:

outputting a voltage suitable for DDR2 to a DDR2 connector via an output end of a voltage transducer, whereby the main board being joined to DDR2;

connecting the DDR2 connector to an end of an adapter;

connecting another end of the adapter to a DDR1 connector; and connecting an input end of the voltage transducer with a ground end of the adapter during the main board being joined to the DDR1 connector such that the output end of the voltage transducer outputs a voltage suitable for DDR1 to the DDR1 connector, whereby the main board is configured to be selectively associated with DDR2 or DDR1 by the presence or absence of the adapter.

2. The method as defined in claim 1, wherein the input end of the voltage transducer is electrically connected to the ground end of the adapter.

3. The method as defined in claim 1, wherein the voltage transducer basically includes a chip, a CMOS, a transistor and a plurality of related resistances; the chip has a fourth connecting end, which is a power input end, to connect with a power source and a grounding resistance respectively; a resistance is disposed between and connected to a first connecting end and a second connecting end of the chip with the joint of the resistance and the second connecting end connecting with a grounding resistance and a source electrode of the CMOS; a leak electrode of the CMOS connects with another grounding resistance, the grid of the CMOS connects with the collector of the transistor and a resistance; the power source connects with another end of the resistance; the transistor has the emitter thereof being grounded and the base electrode thereof connects a second resistance; the power source connects with the other end of the second resistance; the chip has a fifth connecting end connects with the second and the third connecting ends thereof as the output end; and the joint of the base electrode in the transistor and the second resistance is acted as the input end.

4. The method as defined in claim 2, wherein the DDR2 connector connects the adapter with one of pins in the adapter for connecting with the DDR2 connector being grounded and the pin is disposed corresponding to one of unused pins in DDR2; a connecting end of DDR2 connector corresponding to the pin is connected to the input end of the voltage transducer by way of lead wires; whereby, the adapter is connected to the DDR2 connector, the input end is grounded.

5. The method as defined in claim 2, wherein the DDR2 connector connects with the adapter; the adapter is provided with two additional pins in addition to the connecting pins for being joined to the DDR2 connector; one of the two pins is grounded and the other one of the two pins is connected to a connecting end on the adapter so as to connecting with the DDR1 connector for supplying DDR1 power; whereby, when the two pins join with a connector, two ends, which connect with the two pins, is connected to the input end and the output end by way of lead wires with the input end being grounded.

6. A device for a main board in a computer having a DDR2 connector and lacking an onboard DDR1 connector adapted to employ DDR1, being associated with a main board comprising:

a voltage transducer with an input end and an output end, the output end being connected to a DDR2 connector and a DDR1 connector by way of lead wires;

whereby, while the input end is not grounded, the output end outputs a voltage needed by DDR2 to the DDR2 connector; and while the input end is grounded, the output end outputs another voltage needed by DDR1 to the DDR1 connector.

7. The device for a main board commonly shared with DDR2 or DDR1 as defined in claim 6, wherein the voltage transducer basically includes a chip, a CMOS, a transistor and a plurality of related resistances; the chip has a fourth connecting end, which is the power input end, to connect with a power source and a grounding resistance respectively; a resistance is disposed between and connected to a first connecting end and a second connecting end of the chip with the joint of the resistance and the second connecting end connecting with a grounding resistance and the source electrode of the CMOS; the leak electrode of the CMOS connects with another grounding resistance, the grid of the CMOS connects with the collector of the transistor and a resistance; the power source connects with another end of the resistance; the transistor has the emitter thereof being grounded and the base electrode thereof connects a second resistance; the power source connects with the other end of the second resistance; the chip has a fifth connecting end connects with the second and the third connecting ends thereof as the output end; and the joint of the base electrode in the transistor and the second resistance is acted as the input end.

8. The device for a main board commonly shared with DDR2 or DDR1 as defined in claim 6, wherein the input end of the voltage transducer is electrically connected to the ground end of the adapter.

9. The device for a main board commonly shared with DDR2 or DDR1 as defined in claim 8, wherein the DDR2 connector connects an adapter with one of pins in the adapter for connecting with the DDR2 connector being grounded and the pin is disposed corresponding to one of unused pins in DDR2; the connecting end of DDR2 connector corresponding to the pin is connected to the input end of the voltage transducer by way of lead wires; whereby, the adapter is connected to the DDR2 connector, the input end is grounded.

10. The device for a main board commonly shared with DDR2 or DDR1 as defined in claim 8, wherein the DDR2 connector connects with the adapter; the adapter is provided with two additional pins in addition to the connecting pins for being joined to the DDR2 connector; one of the two pins is grounded and the other one of the two pins is connected to a connecting end on the adapter so as to connecting with the DDR1 connector for supplying DDR1 power; whereby, when the two pins join with a connector, two ends, which connect with the two pins, is connected to the input end and the output end by way of lead wires with the input end being grounded.

* * * * *